United States Patent
Tanaka et al.

[11] Patent Number: 6,078,185
[45] Date of Patent: Jun. 20, 2000

[54] APPARATUS FOR CONTROLLING INSERTION OF AN INTEGRATED CIRCUIT INTO A SOCKET FOR TESTING AND MEASUREMENT

[75] Inventors: Tooru Tanaka; Yasunori Kamiya, both of Tokyo, Japan

[73] Assignee: Ando Electric Co., Ltd, Tokyo, Japan

[21] Appl. No.: 08/999,738

[22] Filed: Jul. 25, 1997

[30] Foreign Application Priority Data

Jul. 29, 1996 [JP] Japan ................................ 8-215996

[51] Int. Cl.[7] ............................................. G01R 31/26
[52] U.S. Cl. .............................................. 324/755; 324/765
[58] Field of Search ........................... 324/754, 755, 324/761, 765, 762; 439/482; 438/14, 17; 257/40, 48

[56] References Cited

U.S. PATENT DOCUMENTS

| 4,604,572 | 8/1986 | Horiuchi et al. | ......... 324/760 |
| 4,839,587 | 6/1989 | Flatley et al. | ......... 324/761 |

FOREIGN PATENT DOCUMENTS

| 1-221682 | 9/1989 | Japan . |
| 7-218587 | 8/1995 | Japan . |
| 8-43487 | 2/1996 | Japan . |

*Primary Examiner*—Vinh P. Nguyen
*Attorney, Agent, or Firm*—Darby & Darby

[57] ABSTRACT

Apparatus for inserting an IC, which has a package member and at least one lead projecting to the exterior of this package member, into an IC socket for testing and measurement. The apparatus includes a depressing member which is supported in a direction of moving of depression of the IC and its lead towards the IC socket for insertion, as well as movement in the direction opposite to the direction of depression. There is a heating member for heating the package member supported by the depressing member in a mutually movable manner which moves in the same direction as the depressing member, a first elastic member provided between the heating member and depressing member which deforms depending on a mutual displacement of the heating member and depressing member, and a second elastic member for pushing the heating member in a direction opposite that of the deformation of the first elastic member by movement of the depressing member in the direction of depression of insertion of the IC into the socket.

20 Claims, 4 Drawing Sheets

APPARATUS FOR CONTROLLING INSERTION OF AN INTEGRATED CIRCUIT INTO A SOCKET FOR TESTING AND MEASUREMENT

BACKGROUND OF THE INVENTION

1. Field of the Invention

The present invention relates to an IC measuring mechanism. In particular, the present invention relates to an IC measuring mechanism, provided in a horizontal carrier-type auto-handling device, which reduces the mechanical stress on the IC lead at the time of inserting the IC lead into an IC socket for measuring and conducting testing thereof.

2. Background Art

In the following, the construction of a conventional IC measuring mechanism will be explained based on FIG. 2. FIG. 2 is a cross-sectional diagram showing a depressing member 2, elastic member which forms a compression coil spring 3, IC socket 4, vacuum generating means 6 which forms a vacuum generator, heating member 7, IC 10 and hand 21.

In FIG. 2, hand 21 is formed by means of depressing member 2, compression coil spring 3 (herein after referred to as just "spring"), and heating member 7. A shaft 7D is provided in the upper portion of heating member 7 which is connected in a slidable manner with depressing member 2. Spring 3, which is installed between depressing member 2 and heating member 7, has the power to move depressing member 2 and heating member 7 in opposite directions.

As shown in FIG. 2, IC 10 is loaded onto IC socket 4 which forms an electrode. Suction aperture 7C is provided in the bottom surface 7A of heating member 7 by means of which suction of IC 10 is possible via linkage to vacuum generating means 6. In addition, a heater 7B is housed within heating member 7 for heating IC 10 by means of IC 10 depression by heating member 7 during measurement.

According to FIG. 2, hand 21 is pushed towards IC socket 4 by means of a lift mechanism (not shown in the figure), such that the lead of IC 10 comes into contact with the contact components 4A of IC socket 4 by means of depressing member 2, while heating member 7 is pressed against IC 10 via the elastic strength of spring 3. In this manner, a good heat conductance efficiency is obtained.

In the following, the action of hand 21 will be explained with reference to FIG.'s 3 and 4. FIG. 3 shows the suction action of IC 10 onto the top of the supply stage 13 by means of hand 21. According to FIG. 3, IC 10 is suctioned by means of lowering hand 21 such that the bottom surface 7A of heating member 7 contacts IC 10 and continues to move downward thereafter for another 1~2 mm. Spring 3 also functions to absorb some of the shock from the impact of heating member 7 striking IC 10.

FIG. 4 shows a state in which hand 21 is moving while maintaining suction onto IC 10. According to FIG. 4, heating member 7 is positioned at the lowest end of hand 21 by means of its intrinsic weight.

However, problems arise in that due to the intrinsic weight of heating member 7 and the elasticity of spring 3, bending of the lead often occurs especially when an IC possessing a lead comprising a poor hardness is used (in place of IC 10 in FIG. 2). Particularly, QFP-type and SOP-type IC's possess leads which have a tendency to wear and thin out with time, and hence require considerable attention.

Decreasing the spring 3 elastic strength has been proposed to counteract the aforementioned phenomenon, however, by decreasing the elastic strength of spring 3, for example in FIG. 2, when hand 21 is raised while maintaining suction onto IC 10 and then suddenly stopped, heating member 7 continues upward due to inertia resulting in the release (dropping) of the IC. In other words, during lifting of hand 21, an elastic strength is required of spring 3 which will permit only minute changes due to acceleration of heating member 7. Additionally, further problems associated with a reduction in the apparatus efficiency arise when attempting slow the speed of movement of hand 21.

SUMMARY OF THE INVENTION

It is an object of the present invention to provide an IC measuring mechanism in which reduction of the load placed on the IC lead along with prevention of lead bending is obtained by means of providing a projection arm in a heating member, and a depressing member for applying pressure to said projection arm in the direction opposite the direction of depression of said heating member.

In order to achieve the aforementioned, the present invention provides an IC measuring mechanism for measuring an IC witch has a package member and a lead projecting towards the exterior of said package member, while inserted into an IC socket, said IC measuring mechanism comprising:

a depressing member which is supported in a movable manner such that depression of said lead in a direction towards an IC socket, as well as movement in the direction opposite said direction of depression is possible;

a heating member for heating said package member which is supported by means of said depressing member in a mutually movable manner along the same direction of movement as said depressing member and contacts said package member by means of moving in said direction of depression;

a first elastic member provided between said heating member and said depressing member which deforms in an elastic manner depending on a mutual displacement of said heating member and said depressing member; and a second elastic member for pushing said heating member in a direction opposite said deformation of said first elastic member by means of movement of said depressing member in said direction of depression.

According to the aforementioned IC measuring mechanism, the depressing member forces the projection arm provided in the heating member in the direction opposite the direction of depression of said heating member, and thus the load placed on the IC lead can be reduced, and the generation of lead bending can be prevented.

DETAILED DESCRIPTION OF THE PREFERRED EMBODIMENTS

Figure 1:
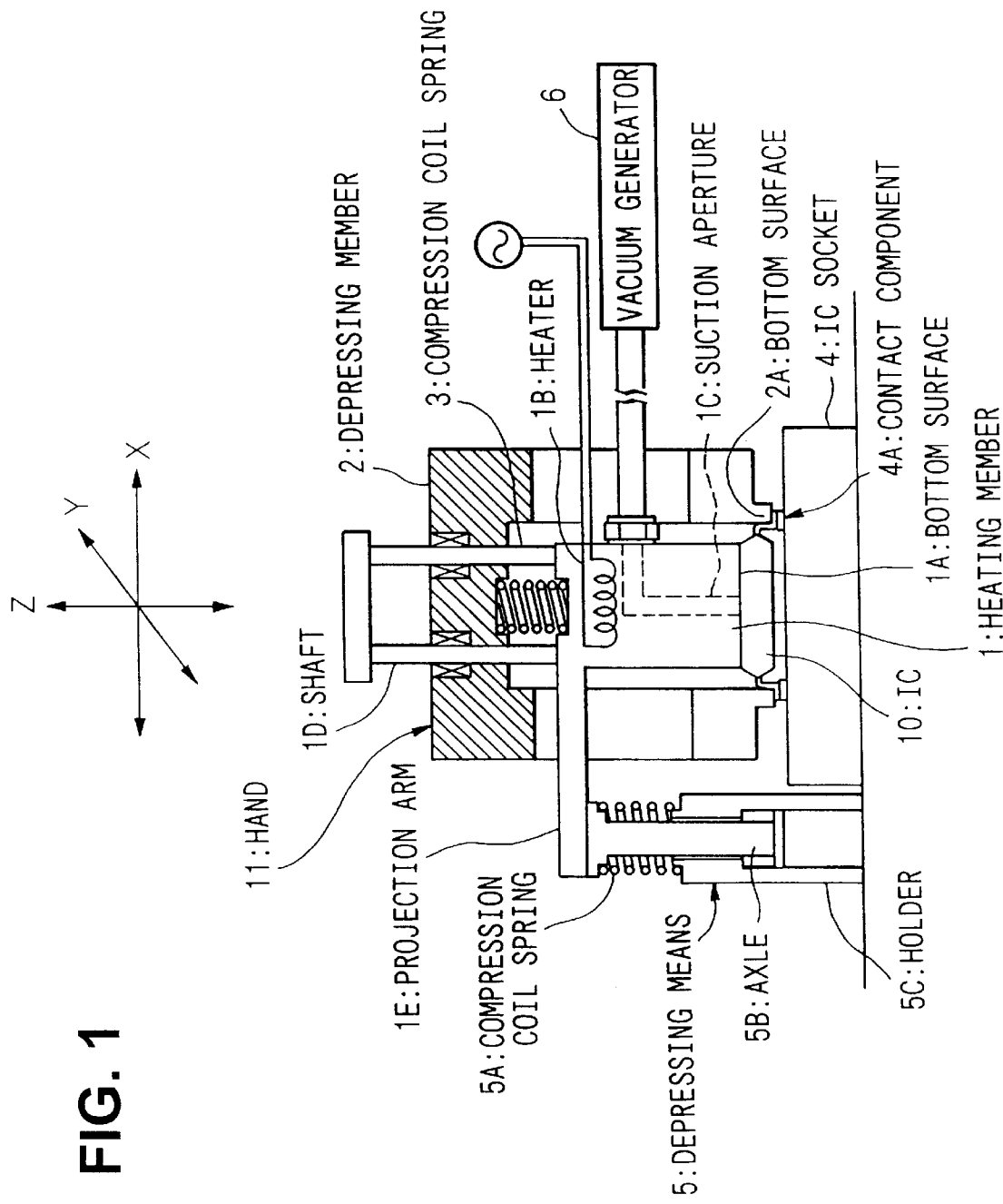
FIG. 1 is a structural diagram showing an IC measuring mechanism according to a first preferred embodiment of the present invention.

In the following, a first preferred embodiment of the present invention will be explained with reference to the figures. FIG. 1 is a structural diagram showing an IC measuring mechanism according to a first preferred embodiment of the present invention which corresponds to a conventional example shown in FIG. 2. Furthermore, in FIG. 1 structural components which have the same use and function as those in FIG. 2 will be denoted by the same numerals and their explanations will be omitted unless otherwise required.

Figure 2:
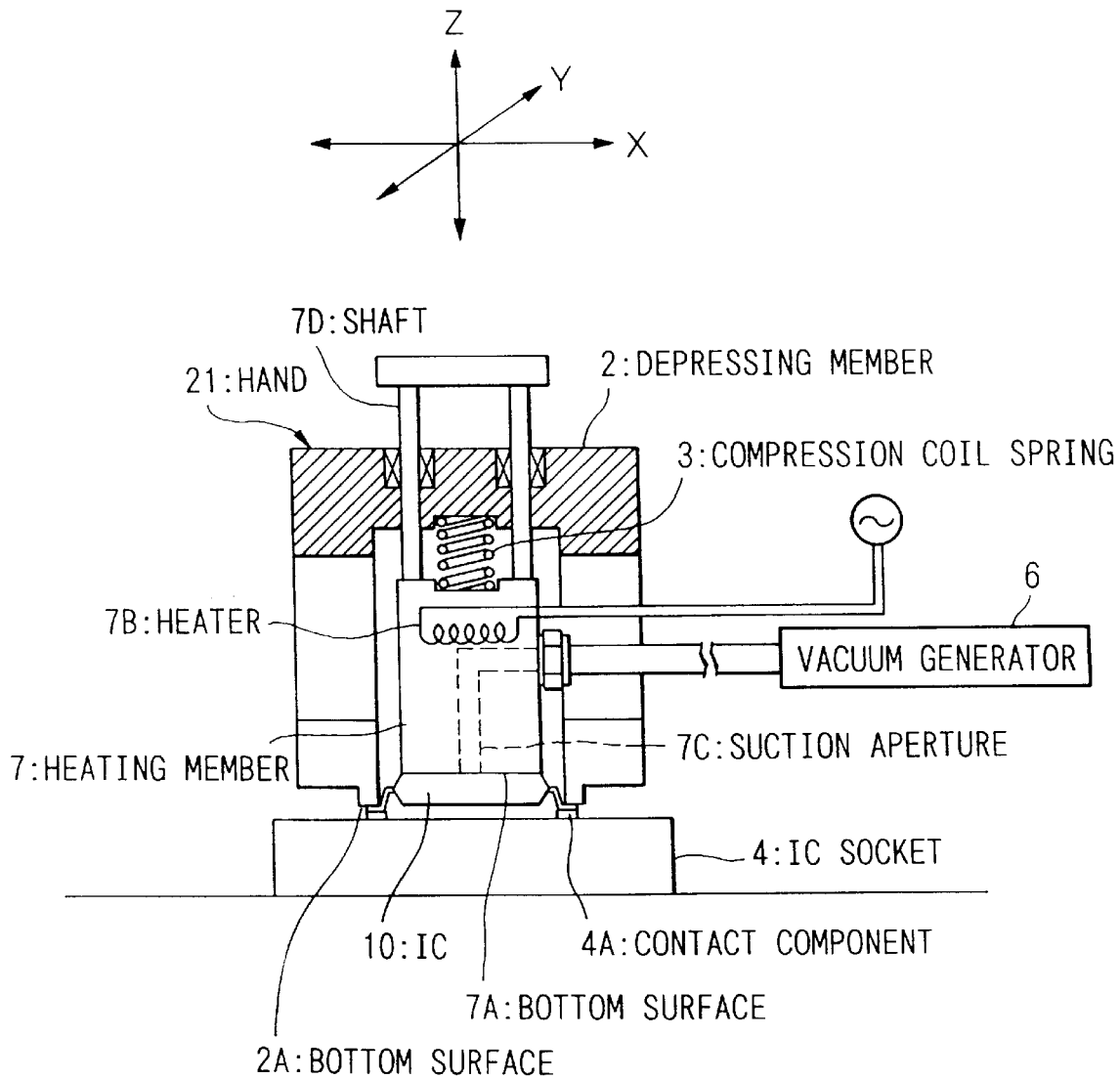
FIG. 2 is a structural diagram showing a conventional IC measuring mechanism.
Figure 3:
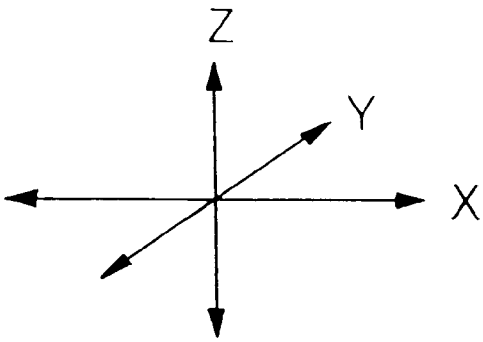
FIG. 3 is a diagram for use in explaining hand action according to a conventional IC measuring mechanism.
Figure 3:
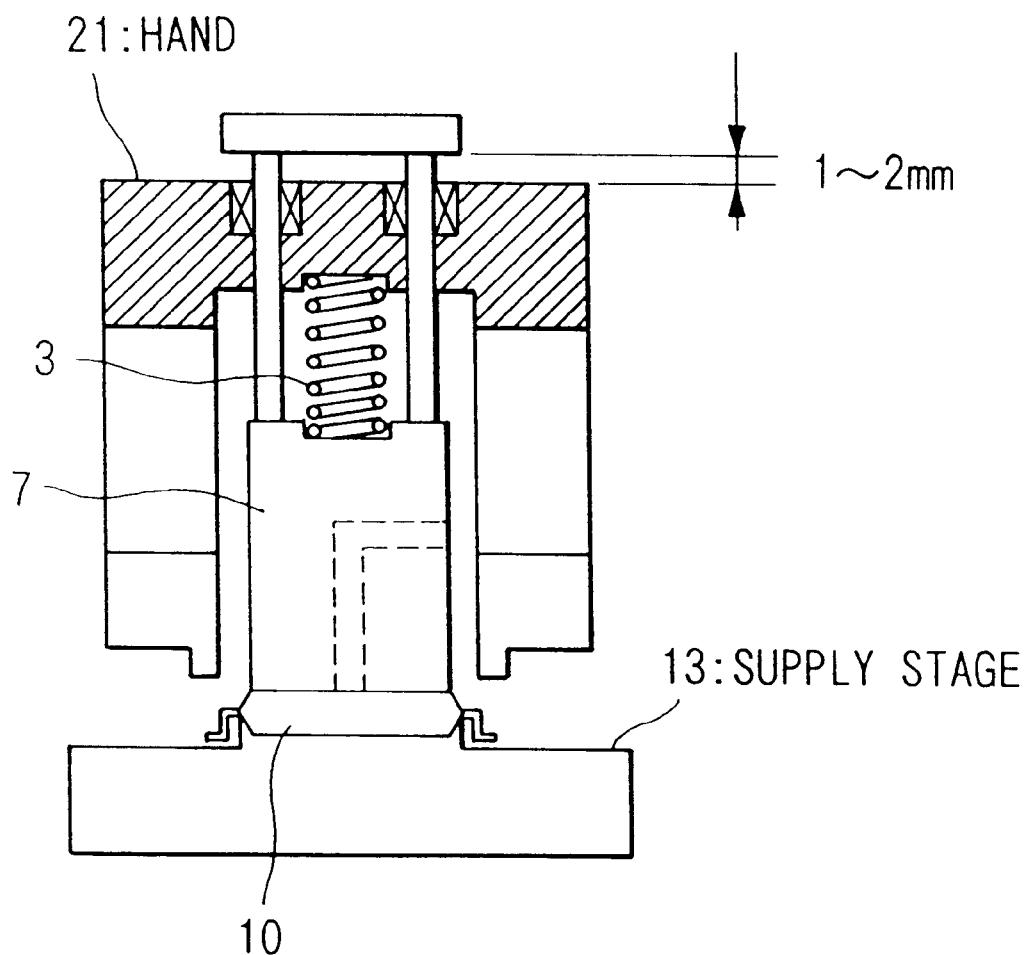
Figure 4:
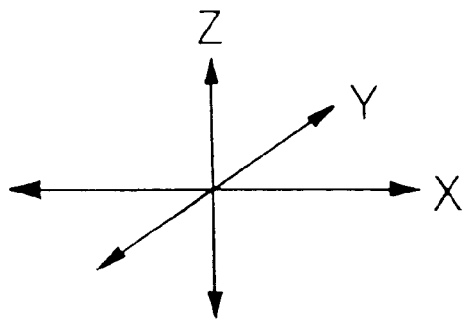
FIG. 4 is a variation of the hand action shown in FIG. 3.
Figure 4:
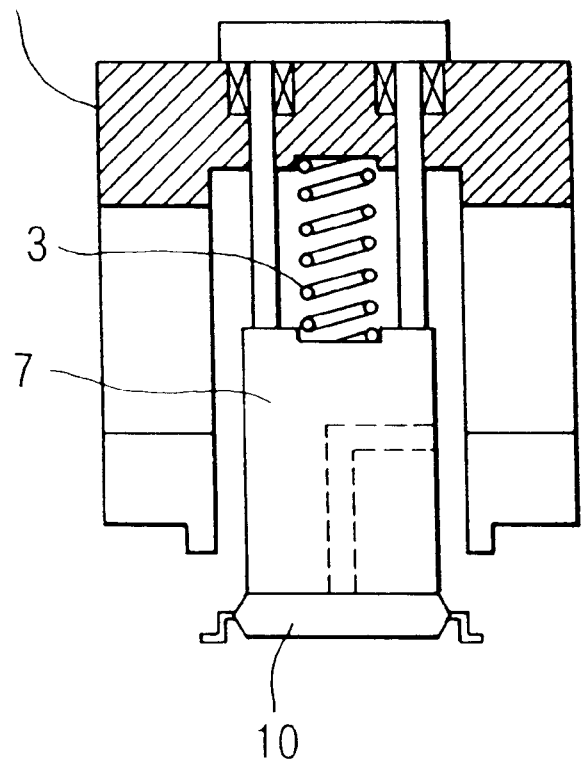

In addition, in FIG. 1, bottom surface 1A, heater 1B, suction aperture 1C and shaft 1D correspond respectively to bottom surface 7A, heater 7B, suction aperture 7C and shaft 7D of FIG. 2, and hence their explanations will also be omitted.

In FIG. 1, a heating member 1, depressing means 5 and hand 11 are provided. Basically, FIG. 1 differs from FIG. 2 in that a projection arm is provided in heating member 1, and a depressing means 5 comprising compression coil spring 5A, axle 5B and holder 5C has been added. In FIG. 1, a holder 5C is provided in the installation face of IC socket 4. This holder 5C forms a step-bore hollow aperture, and supports axle 5B in a vertically slidable manner. Compression coil spring 5A is provided (wrapped around) at the protruding end of axle 5B. This compression coil spring 5A is placed between the top end of axle 5B and the upper edge of holder 5C, and is imparted with the strength to move axle 5B in the upward direction. The movement of axle 5B is restricted by means of contact of the lower end of axle 5B with the step-like portion of holder 5C.

According to FIG. 2, the intrinsic weight of heating member 7 and the elastic strength of spring 3 fall onto IC 10; however, in FIG. 1, the conventional load is reduced by approximately 100 gf due to the opposing force imparted by depressing means 5. In this manner, it is possible to reduce the force onto IC 10 by approximately 100 gf. Hence, under high temperature measuring conditions, an applied pressure on the order of at least 100 gf is required in order to ensure high efficiency heat conduction from the heating member to IC 10.

What is claimed is:

1. Apparatus for inserting an IC having a package member and at least one lead projecting to the exterior of said package member into an IC socket for testing and measurement, comprising:

a depressing member supported in a movable manner to move said IC package member with said lead in a direction of depression towards an IC socket and movement in a direction opposite to said direction of depression;

a heating member for heating said package member supported by said depressing member in a mutually movable manner along the same direction of movement as said depressing member which contacts said package member by moving in said direction of depression;

a first elastic member between said heating member and said depressing member which deforms on mutual displacement of said heating member and said depressing member; and a second elastic member for pushing said heating member in a direction opposite said deformation of said first elastic member upon movement of said depressing member in said direction of depression.

2. Apparatus according to claim 1, wherein said first elastic member has an elastic strength which can overcome the acceleration applied to said heating member when said depressing member is first moved in a direction away from said package member and then stopped.

3. Apparatus according to claim 2, wherein said first elastic member assumes a compressed state between said depressing member and said heating member upon moving said depressing member in said direction of depression.

4. Apparatus according to claim 3, wherein said heating member is housed within a space on the inside of said depressing member.

5. Apparatus according to claim 4, further comprising a projection arm extending to the exterior of said depressing member; and wherein said second elastic member is positioned between said projection arm and a support surface of said IC socket.

6. Apparatus according to claim 5, wherein said heating member further comprises a shaft connected slidably with said depressing member and which restricts movement of said heating member in said direction of depression to a predetermined position.

7. Apparatus according to claim 2, wherein said heating member is housed within a space on the inside of said depressing member.

8. Apparatus according to claim 7, further comprising a projection arm extending to the exterior of said depressing member; and wherein said second elastic member is positioned between said projection arm and a support surface of said IC socket.

9. Apparatus according to claim 8, wherein said heating member further comprises a shaft connected slidably with said depressing member and which restricts movement of said heating member in said direction of depression to a predetermined position.

10. Apparatus according to claim 11, wherein said direction of depression is a vertical downward direction.

11. Apparatus according to claim 10, wherein a surface of said heating member which lies in contact with said package member is suction adhered to said IC by vacuum force.

12. Apparatus according to claim 7, wherein said direction of depression is a vertical downward direction.

13. Apparatus according to claim 12, wherein a surface of said heating member which lies in contact with said package member is suction adhered to said IC by vacuum force.

14. Apparatus according to claim 8, wherein said direction of depression is a vertical downward direction.

15. Apparatus according to claim 2, wherein said direction of depression is a vertical downward direction.

16. Apparatus according to claim 1, wherein said first elastic member assumes a compressed state between said depressing member and said heating member upon moving said depressing member in said direction of depression.

17. Apparatus according to claim 16, wherein said heating member is housed within a space on the inside of said depressing member.

18. Apparatus according to claim 17, further comprising a projection arm extending to the exterior of said depressing member; and wherein said second elastic member is positioned between said projection arm and a support surface of said IC socket.

19. Apparatus according to claim 18, wherein said heating member further comprises a shaft connected slidably with said depressing member and which restricts movement of said heating member in said direction of depression to a predetermined position.

20. Apparatus according to claim 1, wherein said direction of depression is a vertical downward direction.

* * * * *